US005602884A

United States Patent [19]
Wieczorkiewicz et al.

[11] Patent Number: 5,602,884
[45] Date of Patent: Feb. 11, 1997

[54] DIGITAL PHASE LOCKED LOOP

[75] Inventors: Jerzy Wieczorkiewicz; Krishna Shetty, both of Kanata; Terry Kenny, Nepean, all of Canada; Robert L. van der Valk; Menno T. Spijker, both of Rotterdam, Netherlands

[73] Assignee: Mitel Corporation, Kanata, Canada

[21] Appl. No.: 440,939

[22] Filed: May 15, 1995

[30] Foreign Application Priority Data

Jul. 21, 1994 [GB] United Kingdom .................. 9414729

[51] Int. Cl.$^6$ ...................................................... H03D 3/24
[52] U.S. Cl. ......................... 375/376; 375/373; 327/156; 327/159
[58] Field of Search ..................... 375/376, 371, 375/372, 373; 331/1 R, 1 A, 25, 11, 17; 327/156–159, 161–163, 2, 7

[56] References Cited

U.S. PATENT DOCUMENTS

| | | | |
|---|---|---|---|
| 4,489,342 | 12/1984 | Gollinger et al. | 358/17 |
| 4,520,408 | 5/1985 | Velasquez | 375/371 |
| 4,577,163 | 3/1986 | Culp | 331/1 A |
| 4,611,230 | 9/1986 | Nienaber | 375/376 |
| 5,187,722 | 2/1993 | Petty | 375/118 |
| 5,349,331 | 9/1994 | Mentzer | 331/1 A |

FOREIGN PATENT DOCUMENTS 0299724  1/1989  European Pat. Off. .

OTHER PUBLICATIONS

Proceedings of the 40th Annual Frequency Symposium 1986 IEEE New York, pp. 355–365 V. Reinhardt et al "A Short Survey of Frequency Synthesizer Techniques" see page 360 section entitle Direct Digital Synthesis see pp. 361, 362, entitled Phase Interpolation DDS see figures 7, 8, 13, 14.

Primary Examiner—Stephen Chin
Assistant Examiner—Thuy L. Nguyen
Attorney, Agent, or Firm—Marks & Clerk

[57] ABSTRACT

A digital phase locked loop for recovering a stable clock signal from at least one input signal subject to jitter is disclosed. The loop included a digital input circuit receiving at least one input signal, a digital controlled oscillator for generating an output signal at a desired frequency and a control signal representing the time error in the output signal, a stable local oscillator for providing clock signals to the digital controlled oscillator, and a tapped delay line for receiving the output signal of the digital controlled oscillator. The tapped delay line comprises a plurality of buffers each introducing a delay of less than one clock cycle of the digital controlled oscillator. The tapped delay line produces an output signal from a tap determined by the control signal. A digital phase comparator receives at least one input signal from the input circuit and the output signal from the tapped delay line to generate a digital input signal controlling the digital controlled oscillator.

10 Claims, 3 Drawing Sheets

DIGITAL PHASE LOCKED LOOP

BACKGROUND OF THE INVENTION

1. Field of the Invention

This invention relates to a phase locked loop, and in particular to a digital phase locked loop capable of recovering a clock signal from one or more input signals subject to jitter.

2. Description of the Prior Art

In digital networking applications, there is a requirement to provide timing references to interface circuits to T1 and E1 (see EPT) primary rate digital transmission links. These timing signals must meet ACCUNET R T1.5 and ETS1 ETS 300 01111 specifications for a 1.544 MHz (T1) or 2.048 MHz (CEPT) input reference. These specifications impose strict requirements on jitter and stability.

The common method of providing such timing signals is to use a phase locked loop. Typically, this consists of a phase detector comparing the input signals with the output of the loop divided by a suitable factor, a loop filter to eliminate high frequency fluctuations, and a controlled oscillator whose frequency is controlled in such a way as to eliminate the phase difference detected by the phase detector.

It has long been known to employ a VCO (voltage controlled oscillator) as the controlled oscillator in the loop. U.S. Pat. No. 4,577,163 discloses a phase locked loop in which the VCO is replaced by a DCO (digital controlled oscillator) whose output is divided by a factor K and fed back to the phase detector. In the patent, the DCO is clocked by a clock signal $F_{clock}$. Since the DCO cannot respond to phase shifts less than one clock cycle, $F_{clk}$ is the limiting factor for accuracy in this type of phase locked loop. In order to meet ACCUNET specs, a local oscillator having a frequency of 200 MHz or more must be employed.

Such high frequency local oscillators are expensive, energy-consuming, and prone to the emission of electromagnetic interference (EMI).

U.S. Pat. No. 5,218,314 discloses a phase locked loop in which a local oscillator feeds a tapped delay line. The output signal is taken from one of the taps of the delay line according to a phase comparison effected with the input signal. The problem with this arrangement is that it provides no jitter suppression for the reference signals. As a practical matter, due to the inherent properties of the transmission medium, incoming T1 and E1 signals will be subject to jitter, and this must be substantially suppressed in order to meet the ACCUNET specifications.

An object of the invention is to provide a phase locked loop that alleviates the aforementioned problems with the prior art.

SUMMARY OF THE INVENTION

Accordingly the present invention provides a digital phase locked loop for recovering a stable clock signal from at least one input signal subject to jitter, comprising:

a) a digital input circuit receiving said at least one input signal;

b) a digital controlled oscillator for generating an output signal at a desired frequency and a control signal representing the time error in said output signal;

c) a stable local oscillator for providing clock signals to said digital controlled oscillator;

d) a tapped delay line for receiving the output signal of said digital controlled oscillator, said tapped delay line comprising a plurality of buffers each introducing a delay of less than one clock cycle of said digital controlled oscillator, said tapped delay line producing an output signal from a tap determined by said control signal; and e) a digital phase comparator for receiving said at least one input signal from said input circuit and said digital input signal controlling said digital controlled oscillator.

In accordance with the invention, due to the combination of DCO and tapped delay line, the local oscillator can be of low frequency, for example 20 MHz. Typical unfiltered intrinsic output jitter is 0.04 UI (Unit Interval) peak-to-peak with jitter attenuation of 15 dB at 10 Hz, 34 dB at 100 Hz and 50 dB at 5 to 40 kHz. The DCO thus provides a very stable output determined by the stability of the local oscillator. Low power 20 MHz oscillators are conveniently available.

Since the DCO directly controls the tapped delay line, jitter free precision can be maintained to a fraction of a clock cycle.

In a preferred embodiment, the digital controlled oscillator is an adding type rate multiplier whose carry signal generates the output signal when an overflow condition is attained. The remainder term indicates the timing error and is used to generate the control signal for selecting the appropriate tap.

The regenerated clock signal can also be used to control the input circuitry and thus give better jitter performance.

In some applications, two or more input reference signals may be supplied, with the phase locked loop being switchable between the input signals. In order to prevent discontinuities on switchover, the input circuit continually monitors the phase difference between the active and inactive reference inputs. A virtual reference signal is created with a constant phase difference relative to said input signals, so that on switchover no discontinuity arises.

The invention also provides a method of recovering a stable clock signal from at least one input signal subject to jitter, comprising the steps of generating local clock signals with a stable oscillator; clocking a digital controlled oscillator with said local clock signals; feeding a first output of said digital controlled oscillator to a tapped delay line; controlling said tapped delay line with a second output of said digital controlled oscillator representive of a timing error in said first output to generate clock signals having a precision greater than one clock cycle of said stable oscillator; and controlling said digital controlled oscillator with a digital phase comparator that compares the output thereof with said at least one input signal.

BRIEF DESCRIPTION OF THE DRAWINGS

The invention will now be described in more detail, by way of example only, with reference to the accompanying drawings, in which.

DESCRIPTION OF THE PREFERRED EMBODIMENTS

Figures 1, 2:
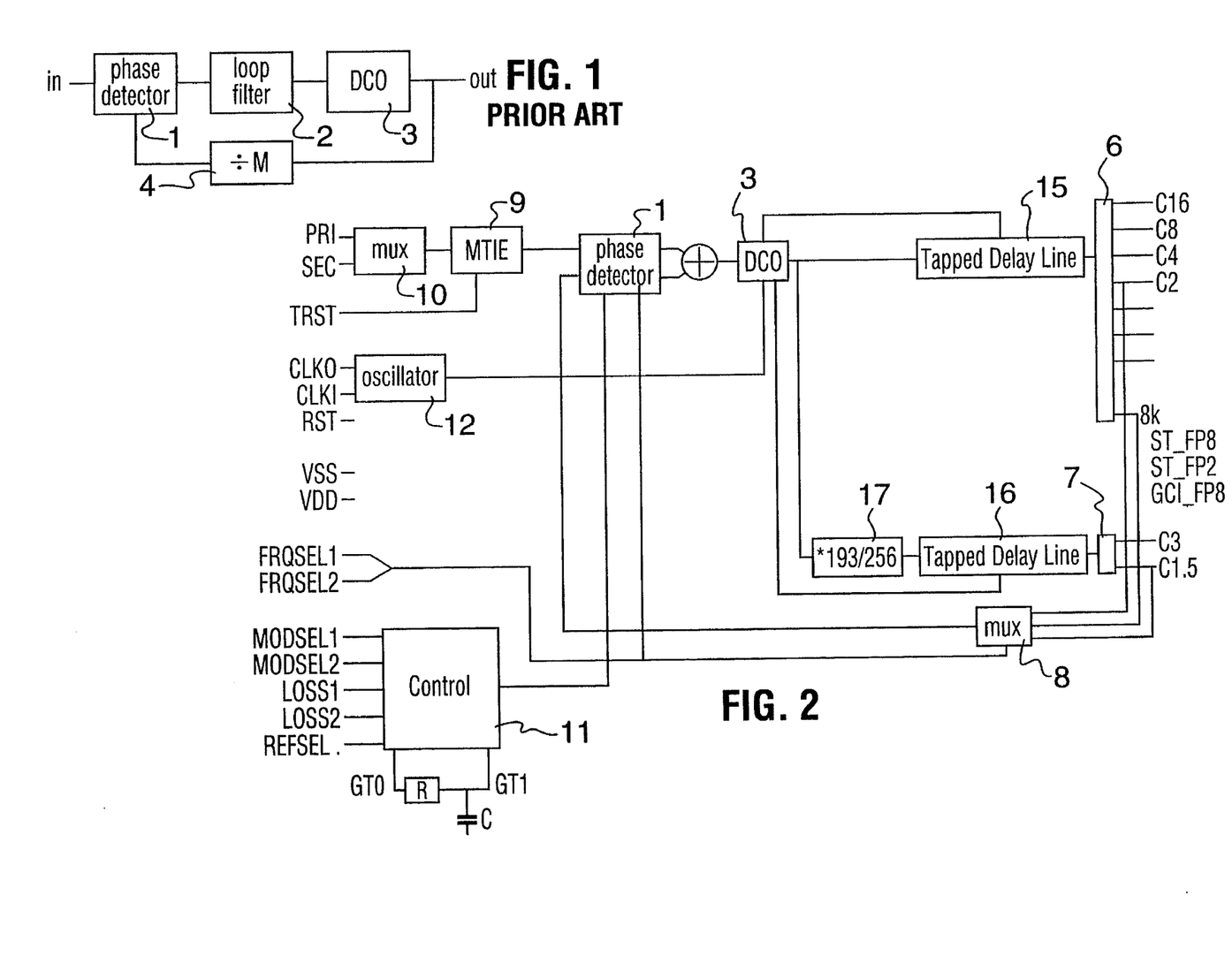
FIG. 1 is a block diagram of a prior art phase locked loop.
FIG. 2 is a block diagram of a phase locked loop in accordance with the invention.

Referring now to FIG. 1, a standard phase locked loop comprises a phase detector 1 receiving a reference signal in, a loop filter 2, a controlled oscillator 3, which is conventionally a voltage controlled oscillator, and a divider circuit 4 generating a feed back signal for the second input of the phase detector 1. The function of the loop filter 2 is to eliminate high frequency fluctuations in the control signal.

The phase detector 1 ensures that the controlled oscillator 3 generates an output in synchronism with the input signal in.

Such a conventional phase locked loop does not provide adequate means for eliminating jitter in the input signal in, such as is present on a T1 or E1 link. Also, even if the controlled oscillator 3 is a digital controlled oscillator, the circuit cannot meet the technical specifications for T1 and E1 links unless the clock frequency of the oscillator clocking the digital controlled oscillator 3 is very high (in the order of 200 MHz or more).

Referring now to FIG. 2, the phase locked loop in accordance with the invention comprises a digital phase detector 1, a digital controlled oscillator 3 feeding respective tapped delay lines 15, 16, actually each consisting of a pair of tapped delay lines, connected to output circuits 6, 7 and providing a range of clock signals at different frequencies respectively for E1 and T1 circuits. The output circuits 6, 7 are connected through multiplexor 8 to one of the inputs of phase detector 1. The other input is connected to MTIE circuit 9, whose function will be described in more detail below, receiving the output of multiplexor 10 receiving primary and secondary inputs PRI, SEC. PRI and SEC can, for example, be first and second incoming T1 links from which it is desired to generate timing signals for the local interface circuits.

Control unit 11 acts as a state machine controlling the operation of the device. Oscillator 12 is a stable 20 MHz crystal oscillator with nominal 50 nanosecond cycle duration. Unit 17 multiplies the output of the DCO 3 by 193/256 to generate timing signals for a T1 interface.

Figure 3:
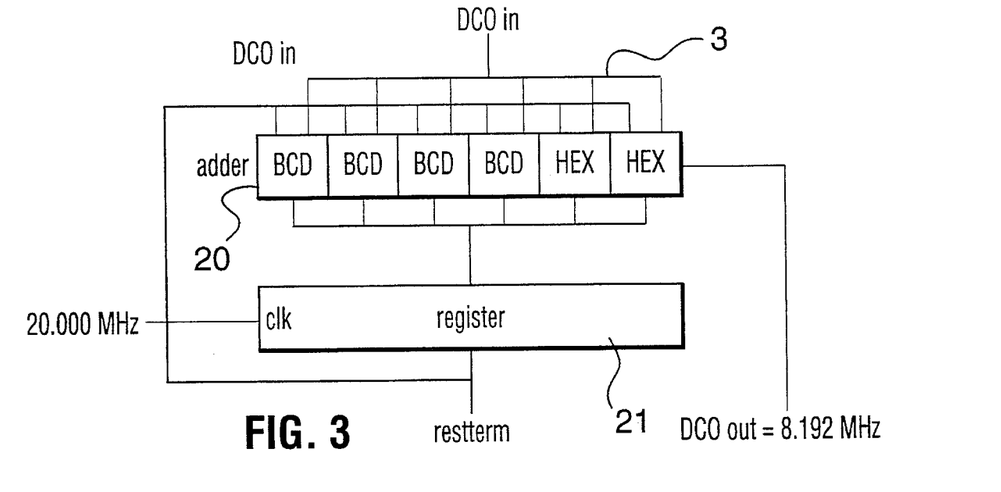
FIG. 3 is a block diagram of a DCO employed in the invention.
Figure 8:
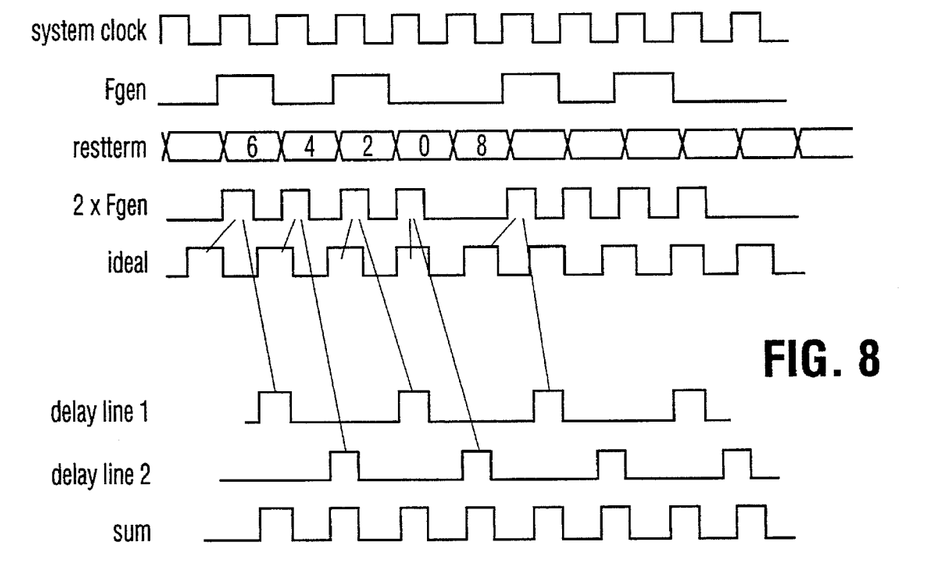
FIG. 8 is a timing chart showing the operation of the delay lines.

The DCO 3 is shown in more detail in FIG. 3. It comprises an adding rate multiplier that generates the desired output frequency. An input word ($DCO_{in}$) is fed to adder 20, whose least significant section is BCD (binary coded decimal) and most significant portion HEX coded for reasons to be explained. The DCO 3 is clocked by the 20 MHz clock signal from stable oscillator 12. As the input word $DCO_{in}$ is repeatedly added to the initial value of the adder P, the adder periodically overflows, and the resulting carry signals constitute the output signal of the DCO 3. If there is a remainder term at the time of overflow, this appears in register 21 and represents the timing error of the DCO output (FIG. 8). This remainder term (restterm) is used to control the tapped delay line in a manner to be described below.

The DCO 3 generates a main frequency of 16.384 MHz for E1 and 12.352 MHz for T1. The frequency generated by the DCO is given by the equation:

$$F_{gen} = \frac{P}{Q} \times f_{clock}/2$$

where Q is the capacity of the adder, P is the initial value of the adder (P is less than Q) and $f_{clock}$ equals the clock frequency of the DCO 3.

As the DCO operates on a clock frequency of 20 Mhz, in accordance with the Shannon theorem, the maximum frequency that can be generated is 10 mhz, i.e. the sample frequency divided by two. This is apparent from FIG. 8, which shows that the DCO changes state on the leading edges of the clock pulses. However, by replacing every edge in the DCO output with a 25 ns pulse, the DCO output frequency is doubled. This signal (16.384 or 12.352 mhz) is adjusted in phase by the two delay lines in each of tapped delay lines 15, 16 (FIG. 2). The sum of the outputs has thus double the frequency of $F_{gen}$.

In typical telecommunications applications, the center frequencies generated by the DCO 3 should be multiples of 8000 Hz, the standard frame frequency. Thus, Q must have for a divisor at least 20,000,000 divided by 8000, which equals 2500, (or in other words $2Q = Pf_{clock}/f_{gen}$). Since P must be an integer, Q must be a multiple of 2500. This result can be achieved by employing a mixed coding scheme, which in the preferred embodiment comprises BCD and Hex as described above.

The need to employ Hex coding for the most significant bits is dictated by frequency converter.

The value for P required to generate a given frequency is indicated in Table 1 below. For a frequency $F_{gen}$ of 8.192 Mhz, according to the formula above P must equal 2,097, 152 dec. This value is coded in a mixed representaton, which is a combined BCD/hex representation in the example. The combined values of the interpolation and cycle slip counters must also be encoded in this representation before they can be added to the value of P for the DCO 3.

The resolution of the DCO 3 is determined by the value of Q, which for one practical embodiment is $2.56 \times 10^6$, and thus the resolution is $0.5 \times 1$ over $2560000 \times 20$ MHz=3.9 Hz. The resolution for the generated frequency is only as good as the ratio between the set number P and the least significant bit. Since this ratio is 1/2097152, the relative accuracy is therefore 0.48 parts per million.

TABLE 1

| value P<br>@ Q = 2,560,000<br>and<br>$f_{clock}$ = 20,000 MHz | fgen | resolution<br>(around<br>center) |
| --- | --- | --- |
| 2,097,152 (dec)<br>D1 (hex) 7152 (dec) | 8.192 MHz | 3.9 Hz<br>0.48 ppm |

Thus, the highest frequency that is generated by the DCO, 16.384 MHz, has a resolution of 7.8 Hz with an accuracy of 0.48 parts per million.

Figure 4:
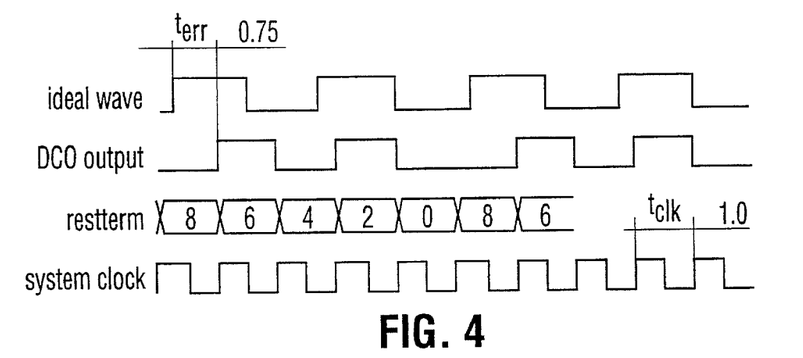
FIG. 4 shows the phase deviation of the DCO output.

FIG. 4 shows the output of the DCO 3. This is delayed by a timing error $t_{err}$ indicated by the remainder term in register 21. As indicated above, the output of the DCO 3 is fed to tapped delay line pairs 15, 16. Each delay line consists of a number of buffers with a total delay of one DCO clock cycle. When the DCO signal is fed through the delay lines and taken from a given tap, the edge in the DCO signal will be somewhere between the two edges of the DCO clock.

The point where the signal has to be tapped from the delay line is determined by the remainder term of the DCO 3 when it generates an edge. The remainder term indicates the delay in generation of the edge. The smaller the remainder the more timely the edge generation. This can be seen from the following simple illustration. If the adder capacity is 8, and the word added is 4, each time adder overflows there will be a remainder of zero, indicating the carry pulse is on time. However, if, for example, the added term is 3, the adder will overflow prematurely, i.e. when there is a remainder of 1 in the register, and this remainder thus represents the timing error.

When the adder in the DCO reaches an overflow condition, the carry toggles the output signal, and thus generates an edge in the DCO output signal $f_{gen}$. The capacitance Q of the DCO represents one cycle of the system clock on which the DCO runs. When the DCO 3 has a remainder term when an edge $f_{gen}$ is generated, the term R represents the time error $t_{err}$ which is a fraction of the clock period $t_{clock}$ of the system clock.

$$t_{err} = \frac{R}{P} \cdot t_{clock}$$

In FIG. 4, the output and remainder term of a DCO with Q=10 is shown. With P=8, the DCO generates a frequency of 4/5 system clock. It can easily see be seen that the frequency of the DCO output signal is correct, but the edges are too late. The larger the remainder term, the later the edge. The first edge has a remainder term of 6. This means that the edge is 6/8=0.75 clock cycle too late. When the remainder term is 0, the edge is right on time.

The edge from the DCO 3 has to be advanced in time by the term $t_{err}$ in the formula above. This is achieved by delaying the edge with t, the complement of $t_{err}$.

$$t_{del} = (1-R/P)t_{clock}$$

The delay calculation uses the assumption that a certain number of delay elements "fits" in one clock cycle. However, over temperature, voltage and process variations this is very irregular. Therefore the delay line provides a length that is suited for worst case conditions according to the process of implementation. Also a measurement is performed to calculate the number of delay elements that fits in a single system clock cycle. For this reason the delay line elements are connected to the D inputs of D-flip-flops, with a clock driven by the system clock. By measuring the place where the significant 0/1 transition in the sampled delay line occurs (with a priority encoder), the number of elements in one complete system clock cycle is determined. This number is combined with the remainder term to calculate the precise tap that should be used.

The remainder term provided by the DCO 3 is much larger than the tapped delay can cope with; by using 7 bits of the remainder term the accuracy is sufficient for driving a tapped delay line with 64 taps (7 bits would normally correspond to 128 taps, but one bit is lost in the calculation process. The number of taps guarantees sufficient phase accuracy over the full temperature and voltage range while the size of the circuitry remains acceptable.

The outputs of the DCO 3 consist of a clock signal (basically 8.192 MHz) and a remainder term. The remainder term is used directly for the driving of the tapped delay line 4,5, as explained above. The tapped delay line pair 15 generates a 16.384 MHz clock and this clock drives dividors 6 to generate the C8, C4, C2, GCI_FP8, ST_FP8 and ST_FP2 signals.

The DCO can be extended with, for instance, 9 bits extra on the adder stage. The added 9 bits will always indicate a number of whole cycles that are generated by the original DCO. If one takes the contents of the whole DCO plus extension and performs the multiplication 193/256, the number that results can be used for accurate generation of a frequency which is 193/256 8.192 MHz=6.176 MHz. This frequency is in turn used to generate a frequency of 12.352 MHz required for T1 circuits.

The multiplication by 193 is performed in unit 17 using shift and add functions: 193 equals 128+64+1. This however is only done for the few bits that have significance on the output. The lower bits of the DCO are not of interest since the accuracy of the delay lines for both T1 and E1 demand limited phase accuracy. (The DCO itself is of course very long since there not only the phase accuracy has a minimal quality, but also the frequency; this adds extra bits). The most significant bits that would result from the multiplication are of no interest since they represent whole cycles.

A last element on the indirect frequency synthesizer is the means to align the 8 kHz pulse with the T1 clock. The E1 clocks and the 8 kHz pulses are hard linked and always have the correct phase relation. However the divided T1 clock of 1.544 MHz may not automatically come to the correct phase relation of the 8 kHz since the divisor of 12.352 MHz to 1.544 MHz is never forced to do so. This problem is solved with a reset circuit on the T1 divisors driven by the 8 kHz pulse. This resetting never has any asynchronicity problems since the T1 is, through the 193/256 operation, hard linked to the E1 clocks.

Figure 5:
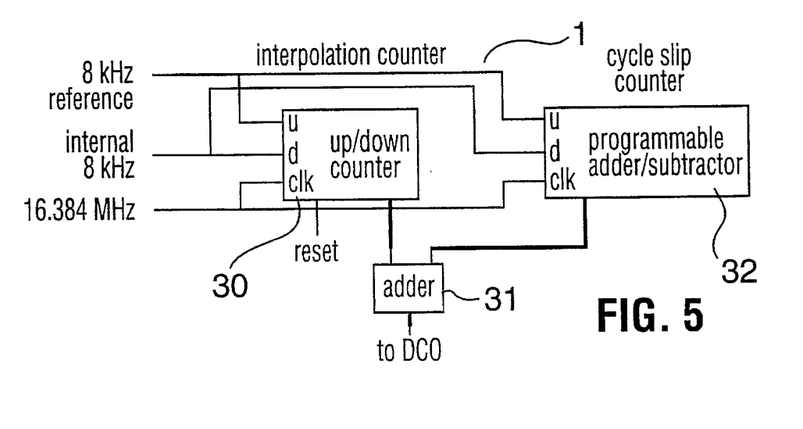
FIG. 5 is a block diagram of the phase detector.

The phase detector 1 will now be described in more detail with reference to FIGS. 5 and 6. As shown in FIG. 5, this comprises an up/down counter 30, adder 31 and programmable adder/subtractor 32.

Figure 6:
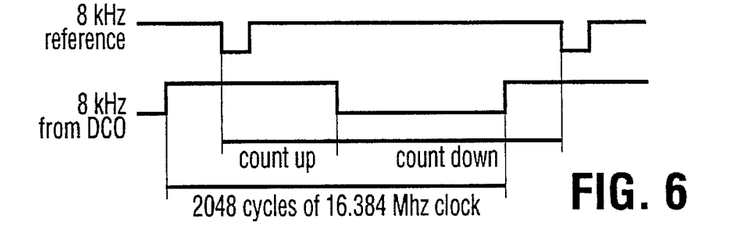
FIG. 6 shows the phase difference measured with an interpolation counter.

The phase difference for two 8 kHz references is shown in FIG. 6. The phase error is considered of consisting of two parts, an absolute part, and a relative part. The absolute part is a measure of the phase relationship between the two frequencies over one cycle, and the relative part keeps track of cycle slips between the two frequencies. The absolute measurement is straightforward and uses the same configuration whether the reference is 8 kHz, 1.544 MHz, or 2.048 MHz.

A number of 16.384 MHz cycles (for E1, 12,352 for T1) in the measurement interval is typically even, so the result of the measurement is typically even. However, due to the sampling of the reference frequency with a clock that is following the reference, the measurement interval varies with ±1 clock cycle and may become an odd number of clock cycles. This ensures that the LSB of the measurement is not fixed and therefore the accuracy of the measurement is increased. Due to the absolute measuring method with an up/down counter, half an 8 kHz cycle phase difference comes out of the absolute measurement as 2048 cycles (whereas 62.5 μs is 1024 clock cycles of 16.384 MHz).

The relative measurement is more variable and uses an equivalent value for each cycle slip that occurs: A cycle slip of 8 kHz is identical to 2048, but must match if concatenated to the absolute measurement. The same holds for measurement of the 2.048 MHz reference. Thus the relative measurement counts 4096 or 16 for every cycle slip, depending on selection of 8 kHz or 2.048 MHz as reference.

If the selected reference is 1.544 MHz, the settings for relative and absolute counters are precisely the same as the settings for 2.048 MHz. Only the counting frequency used in the counters is reduced to the 12.352 regenerated frequency. This has only bearing upon the low pass frequency, which is lowered with a factor 193/256~0.75.

The absolute and relative measurements are combined with a simple adder 31.

The basic arrangement used for a low pass filter included in phase detector 1 is quite straightforward. The counter 30 measures the actual phase error, the phase error is taken over (sampled) as a frequency offset in the DCO. The DCO integrates this offset value for the next sample period and thus reduces the measured phase error.

It should be noted that the frequency offset resulting from the measurement is very small. In the next sample period the error will only be canceled for a minor part. This attenuation type of mapping combines with the sampling rate to form an effective low pass frequency of a few Hz.

Since the error is reduced a bit in the next sampling period, the next time the "repair" of the error will become slightly smaller. It can be calculated that the error repair curve closely mimics a first order low pass function, which happens to be the function that we would like to achieve. The quality of the curve is set with the ratio between sampling rate and effective low pass frequency (which precisely equals the attenuation). In this configuration this means that with 8000 Hz sampling and effective low pass of 2 Hz, the first order is approached with at least more than 60 dB quality. This is important since this maps to a worst case transfer outside the pass band of 60 dB, which is better than the ACCUNET spec. This approach is very crude and can be refined quite easily.

The effective low pass frequency can be calculated from the frequency offset generated from a given phase error. In a first order system the tangent of the output at the beginning of the step response hits the 100% input value mark precisely after $\tau$ seconds. This $\tau$ results in a certain low pass frequency.

The references used for the phase measurement always have a maximum jitter frequency content according to the Shannon theorem; an 8 kHz square wave signal never carries jitter above 4 kHz. In turn a 2.048 MHz reference carries jitter up to a maximum of 1.024 MHz. If a reference is divided the maximum jitter frequency goes along with it, folding all higher components into the next maximum jitter band. As such a 2.048 MHz signal with 32 kHz jitter, divided to 8 kHz, folds the 32 kHz jitter into the DC range. Since the PLL passes DC jitter undisturbed the folded jitter is not suppressed, which violates the ACCUNET specs. Thus the frequency used for phase measurement must always be the maximum available without division.

If a higher reference frequency is used, but the counters keep running on the same counting frequency, the low pass frequency does not change, but the quality of the first order low pass function increases. With a reference frequency of 2.048 MHz and a low pass of 2 Hz this means theoretical stop band performance of −120 dB. This effect is used in he sense that no matter whether the input reference is 8 kHz, 1.544 MHZ or 2.048 MHz, the same phase detector is used, without major modifications.

Figure 7:
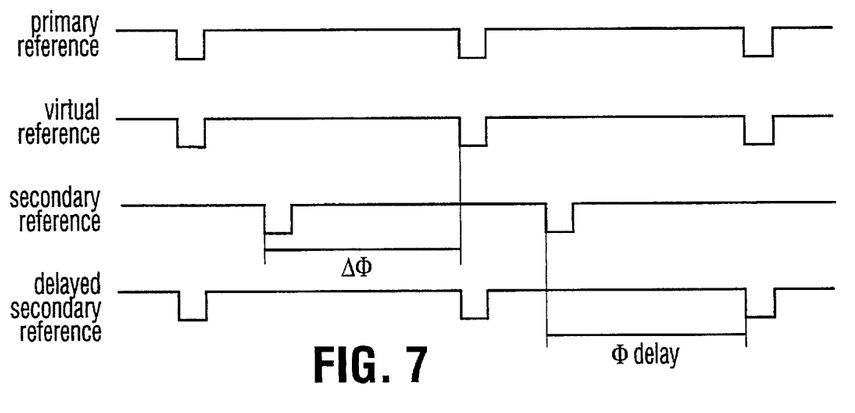
FIG. 7 is a timing chart showing the reference signals.

The MTIE circuit 9 will now be described in more detail with reference to FIG. 7, which shows the primary and secondary PRI, SEC, input signals to the multiplexor circuit 10. The MTIE circuit 9 creates a virtual reference, which has a constant phase relationship to the primary reference PRI. The phase difference can in fact be zero, so that the virtual reference is in phase with the primary reference, although the actual phase difference is not important. The secondary reference SEC is phase shifted by an amount $\Delta\phi$, which is continually monitored.

The secondary reference is delayed by an amount equal to $\Delta\phi$ so as to bring the delayed secondary reference into phase with the virtual reference. Thus, when it becomes necessary to change over references due to degradation of the primary reference, no phase jump is observed since the phase derived from the secondary reference is maintained in phase with the previous reference derived from the primary reference.

The shift amount is determined before the switch over takes place by measuring the phase distance between the current virtual reference and the not yet selected reference.

An important feature is the use of the regenerated 16.384 MHz clock as a sampling clock. If the 20 MHz clock were used, sampling inaccuracy in the steady state would result, and this would introduce low frequency drifts relative to the reference with a maximum value of 50 ns. Though this is acceptable according to the specifications, the better performance is preferred.

Each time a measurement is completed the result is stored in a register. Upon switchover, the measured value can be used to drive a counter which generates the phase shift of the new reference. In this counter the new reference is used to start the counter and generate a new reference pulse at the 0 position. A detail in this process is that if a new reference pulse is detected and the counter has not reached the 0 position yet, the virtual reference is generated just the same while starting a new count cycle; if this mechanism were not be present cycle slips might occur.

The switchover from one reference to another is guarded. After selection of the new reference input, the circuit waits for three periods of the virtual reference before it can switch back to the previous reference signal. This is maximum the settling time of the mechanism that measures the phase difference between the to-be-used reference and the current virtual reference. Fast switching between references inputs can therefore not disrupt the functioning of the MTIE circuit 9.

The MTIE circuit 9 behaves identically for T1, E1 and 8 kHz references.

The MTIE circuit 9 thus samples the reference clocks and determines the phase relation between the not used external and the used external reference. The phase relation is stored as a simple countervalue. Upon a rearrangement the value is used to delay the new references edges to a more correct position in the MTIE sense. This is done by a simple loadable down counter.

If the down counter after rearrangement reaches the 0 position, the internal reference signal VIR (Virtual Internal reference) is given. Upon a new detection of an edge on the external reference the counter starts again to count down. If the counter has not reached 0 yet, but an external reference edge is already detected (which basically is too early and points to jitter, small or large) the counter is directly reset to start counting again, while a VIR is given. This is acceptable; this way the MTIE circuit just seems to pass the jitter, which is of course allowable.

The described phase locked loop can be used for synchronization and timing control for T1 and CEPT digital transmission links, ST bus clock and frame pulse sources, and primary trunk rate converters, for example.

In addition to providing synchronized PLL outputs at 2.048, 1.544 MHz, or 8 kHz primary rate, the PLL can also provide additional high speed output clocks at rates of 3.088 MHz, 4.096 MHz, 8.192 MHz, and 16.384 MHz for back frame synchronization. Also the device can be used in conjunction with an analog phase locked loop to generate 2 Mhz, or 155 Mhz signals for ATM, for example.

The phase locked loop has four modes of operation, namely normal and manual mode, holdover mode, freerun mode, and automatic mode.

In manual mode operation, the input reference selection is accomplished using a 2-to-1 multiplexer, with the RSEL pin providing selection control. As shown in Table 2, for MANUAL mode operation RSEL=0 selects PRI as the primary reference input, while RSEL=1 selects SEC as the primary reference input.

TABLE 2

| Mode | RSEL | Reference Input Selected |
| --- | --- | --- |
| Manual | 0 | PRI |
| Manual | 1 | SEC |
| Automatic | 0 | state machine control |
| Automatic | 1 | state machine control, but treats SEC as primary and PRI as secondary |

There are three possible input frequencies for selection as the primary reference clock. These are 8 kHz, 1.544 MHz, and 2.048 MHz. Frequency selection is controlled by the logic levels of FSEL1 and FSEL2, as shown in Table 3. This variety of input frequencies was chosen to allow the generation of all the necessary T1 and E1 clocks from either a T1, E1 or frame pulse reference source.

TABLE 3

| FSEL 2 | FSEL 1 | Input Reference Frequency |
| --- | --- | --- |
| 0 | 0 | Reserved |
| 0 | 1 | 8 kHz |
| 1 | 0 | 1.544 MHz |
| 1 | 1 | 2.048 MHz |

In normal AUTOMATIC mode operation, the REFSEL input (FIG. 2) is set to 0 to allow the STATE MACHINE to select the reference input based on the state of the LOSS1 and LOSS2 inputs. If the PRI reference signal is lost (LOSS1+HIGH, LOSS2+LOW), then the PLL enters HOLDOVER mode immediately and stays there fore a predetermined time as controlled by the RC time constant connected to the Guard Time input (GTi, GTo).

After the guard time has been exceeded, the reference will be switched to SEC if the primary reference continues to remain lost. The time constant determined by the RC circuit connected to the GTi input provides the hysteresis on automatic switching between PRI and SEC during very short interruptions on the primary reference signal. The Guard Time, $t_{gt}$, can be predicted using the step response of an RC network. The capacitor voltage on the RC circuit is described by an exponential curve. When the capacitor voltage reaches the positive going threshold of GTi a logic HIGH level results. This causes the state machine to move from the holdover state of PRI to the state of using SEC as the input reference. A logarithmic equation that can be used for prediction of the Guard Time $t_{gt}$, is given by:

The STATE MACHINE 11 continues to monitor the LOSS1 input and switches back the reference to PRI once the primary reference becomes functional as indicated by the LOSS1 input. A logic level HIGH on both the LOSS1 or LOSS2 inputs indicates that none of the external references are available. Under these circumstances, the phase locked loop will be switched into the HOLDOVER STATE (within a specified rate of frame slip) until a fully functional reference input is available.

The holdover option of the phase locked loop provides the user with the capability of maintaining the integrity of output signals when the input reference signals are lost. Holdover performance specified as the rate of slip (i.e. amount of slip on 60 seconds) of the 8 kHz reference input. For both the T1 and E1 outputs the rate of slip was measured as a function of the input reference frequency. The results measured over an observation period of 60 seconds, are presented in Table 4.

TABLE 4

| Reference Input Frequency | % of Frame Pulse Slip |
| --- | --- |
| 8 kHz | 8% |
| 1.544 MHz | 58% |
| 2.048 Hz | 58% |

As indicated, the phase locked loop uses its own generated frequency for sampling in data on the reference inputs. The reason for doing so is that this achieves synchronous sampling, giving best performance for intrinsic jitter. If the 20 MHz clock were used the accuracy would fall, especially on the low frequency wander aspect.

The circuit is truly asynchronous to the outside world, but also asynchronous on its internals. The points where the major blocks of the circuit interface in an asynchronous way are all sampled with a D-flip-flop to cover this.

Basically it detects edges on incoming signals and decides for two counters whether to count up or down and, in the case of the inter counter, when to reset. The problem lies in the relation of the two elements.

At the detection of an edge of the reference input the inter counter, which interpolates within one reference cycle, is taken over into a register and reset. At the same moment a signal is given to an arithmetic logic unit (ALU) that this value is available and can be sampled over (sampling is necessary here since the phase detectors must run on the clk1612, but the DCO and the ALU must run on the 20 MHz clock. The signal REGEN-B is used for this signaling.

The slip counter is triggered for up and down counting by either the reference edges (up, thus driving the DCO to higher output frequency) or the internal edges (down). If both edges are seen at the same time no counting is done.

The inter counter starts counting up from its reset point, until a negative edge on the internal feedback signal makes the counter turn over to the negative range. Upon detection of the edge the counter is kept silent for one period. This is necessary to make sure that the phase detection of a signal with itself would make the phase detection perfect; then the result is 0 (electronically spoken this is to balance the reset phase of the inter counter).

The result of the process of the inter counter can be positive or negative, and largely depends on the precise place of the edges. If the edges change from one measurement to another such that the value of the inter counter swings from very negative to very positive (or vice versa), the slip counter must indicate a slip, thus reducing the large swing. (In coding terms; the coding must be strictly monotone).

The operation of the inter counter places the edges for a slip around the edge where the reference itself has its edge. However, a slip has its effect on the inter counter not at the moment that it occurs, but one measurement cycle later. Thus a cycle slip must be delayed till the next measurement. This is done by delaying the loading of the register of the slip counter, so that it is not taken over directly by the DCO, but one measurement cycle later.

The performance of the whole circuit largely depends on the granularity of the tapped delay. Since the circuit must operate over all temperature ranges, process and voltage variations (mil spec) the nominal, best case and worst case delays are important.

From the LSI LCA300K databook it can be concluded that the Kp (process variation), ×(voltage variation) and Kt (temperature variation) parameters for the chip are:
Best case: 0.7–0.87–0.83=0.50547

Worst case: 1.4–1.13–1.15=1.8193

The tapped delay line is built with one sampling circuit for measurement of the number of taps in one clock cycle, two actual delay lines and a number of tristate busses that are driven from these lines. The use of two lines is permits switch over from one tap to another without running into dangerous timing problems. One delay line receives a pulse which is tapped with one tap, while the other tap is fully 0, but is being switched from one tap to another.

If no pulse at all is passed, no tristate buffer is active. In order to keep the bus to a fixed value the bus is pulled down actively by extra tristate buffers (with 0 on the data input).

The tristate buffers do not have the driving strength for 64 buffers on one line, so they are bundled in groups of 16 and OR-ed together.

The E1 dividers take the generated 16 MHz clock and divide it to the right frequencies, including the FP2 and FP8 pulses. The reset is the only asynchronous details. Since the rest of the circuit is also resetted this never gives problems.

The T1 divider circuits take the CLK12 clock (from the tapped delay) and divide it to the right frequency. However, there is one problem in this in the form of the phase relation between E1, T1, and the FP8 pulse. The T1 circuit is reset around the FP8 pulses to ensure the correct phase relationship. However, this is never the case for a once reset T1 phase should always be in the correct phase position at the place where the reset occurs; the reset then is at the right moment and does not make any difference in the sense that the T1 dividers would have to come to the same positions without the reset.

All counters and adders can be built with primitives. Counters are based on ripple effects with NAND/NOR sequences for the ripple stage so that delays remain quite minimal.

The described phase locked loop thus provides an inexpensive method of recovering clock signals, for example in an E1 or T1 environment, that meets Accunet specifications. The phase locked loop particularly lends itself to large scale integration into a single chip.

We claim:

1. A digital phase locked loop for recovering a stable clock signal from at least one input signal subject to jitter, comprising:
   a) a digital input circuit receiving said at least one input signal;
   b) a digital controlled oscillator for generating an output signal at a desired frequency and a control signal representing the time error in said output signal;
   c) a stable local oscillator for providing clock signals to said digital controlled oscillator;
   d) tapped delay line means for receiving the output signal of said digital controlled oscillator, said tapped delay line means comprising a plurality of buffers each introducing a delay of less than one clock cycle of said digital controlled oscillator, said tapped delay line means producing an output signal from a tap determined by said control signal;
   e) a digital phase comparator for receiving said at least one input signal from said input circuit and said output signal from said tapped delay line means to generate a digital input signal controlling said digital controlled oscillator; and
   wherein said digital controlled oscillator is an adding type rate multiplier that generates said output signal when attaining an overflow condition, the remainder term upon attainment of said overflow condition generating said control signal.

2. A digital phase locked loop as claimed in claim 1, wherein said tapped delay line means comprises a pair of tapped lines to permit the generation of a frequency at twice the output frequency of the digital controlled oscillator.

3. A digital phase locked loop as claimed in claim 1, wherein said oscillator is coded according to a mixed coding scheme.

4. A digital phase locked loop as claimed in claim 1, wherein the most significant portion of the digital input signal is binary coded and the least significant part is BCD coded.

5. A digital phase locked loop as claimed in claim 1, wherein said digital input circuit and said phase comparator are clocked by signals regenerated from said phase locked loop.

6. A digital phase locked loop for recovering a stable clock signal from at least one input signal subject to jitter, comprising:
   a) a digital input circuit receiving said at least one input signal;
   b) a digital controlled oscillator for generating an output signal at a desired frequency and a control signal representing the time error in said output signal;
   c) a stable local oscillator for providing clock signals to said digital controlled oscillator;
   d) tapped delay line means for receiving the output signal of said digital controlled oscillator, said tapped delay line means comprising a plurality of buffers each introducing a delay of less than one clock cycle of said digital controlled oscillator, said tapped delay line means producing an output signal from a tap determined by said control signal;
   e) a digital phase comparator for receiving said at least one input signal from said input circuit and said output signal from said tapped delay line means to generate a digital input signal controlling said digital controlled oscillator; and
   wherein said digital input circuit has two inputs for receiving respective first and second input signals, either one of said input signals being capable of serving as a reference signal for said digital controlled oscillator, means for continually monitoring the phase shift between said first and second input signals, and means for generating upon changeover from one input signal to the other a virtual reference signal from said other input signal that is phase shifted thereto by an amount substantially equal to said phase shift between said first and second input signals so as to minimize phase jump on changeover between input signals.

7. A digital phase locked loop as claimed in claim 1, further comprising a state machine for continually monitoring and controlling the status of the loop.

8. A digital phase locked loop as claimed in claim 1, further comprising a fractional multiplier for deriving from the output of said digital controlled oscillator a further signal at a frequency which is a fraction of the output frequency of the digital controlled oscillator.

9. A method of recovering a stable clock signal from at least two input signals subject to jitter, comprising the steps of:
   a) generating local clock signals with a stable oscillator;
   b) clocking a digital controlled oscillator with said local clock signals;
   c) feeding a first output of said digital controlled oscillator to a tapped delay line;
   d) controlling said tapped delay line with a second output of said digital controlled oscillator representive of a timing error in said first output to generate clock signals having a precision greater than one clock cycle of said stable oscillator;

e) controlling said digital controlled oscillator with a digital phase comparator that compares the output thereof with said at least one input signal; and wherein a virtual reference signal is created that has a constant phase relationship to said at least two input signals such that any phase jump occurring on changeover between said input signals is minimized.

10. A method as claimed in claim 9, wherein said input signal is sampled with a circuit clocked by clock signals recovered by said loop.

* * * * *